(12) United States Patent
Zeytoonian (10) Patent No.: US 8,128,330 B2
(45) Date of Patent: Mar. 6, 2012

(54) FASTENING APPARATUS

(75) Inventor: Paul N. Zeytoonian, Sudbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 469 days.

(21) Appl. No.: 12/184,486

(22) Filed: Aug. 1, 2008

(65) Prior Publication Data

US 2010/0025596 A1 Feb. 4, 2010

(51) Int. Cl.
*F16B 13/04* (2006.01)

(52) U.S. Cl. .............. 411/372.5; 411/373; 411/999

(58) Field of Classification Search .............. 411/82, 411/43, 34, 44, 38, 372.5–373, 429, 999
See application file for complete search history.

(56) References Cited

U.S. PATENT DOCUMENTS

| | | | | |
|---|---|---|---|---|
| 4,054,045 A * | 10/1977 | King, Jr. | | 72/40 |
| 4,457,652 A * | 7/1984 | Pratt | | 411/38 |
| 4,494,347 A * | 1/1985 | Uhlig | | 52/508 |
| 4,518,278 A * | 5/1985 | Koch | | 403/230 |
| 4,755,092 A * | 7/1988 | Yaniv | | 411/554 |
| 5,046,348 A * | 9/1991 | Pratt | | 72/356 |
| 5,399,052 A * | 3/1995 | Volkmann et al. | | 411/43 |
| 5,415,755 A * | 5/1995 | Wise et al. | | 204/280 |
| 5,417,529 A * | 5/1995 | Volkmann et al. | | 411/82 |
| 5,749,670 A * | 5/1998 | Astor | | 403/269 |
| 6,050,764 A * | 4/2000 | Oberle et al. | | 411/354 |
| 6,206,788 B1 * | 3/2001 | Krenzler | | 473/245 |
| 7,150,594 B2 * | 12/2006 | Keener | | 411/34 |
| 2005/0201845 A1 * | 9/2005 | Keener | | 411/44 |
| 2006/0062650 A1 * | 3/2006 | Keener | | 411/34 |
| 2010/0170625 A1 * | 7/2010 | Liao et al. | | 156/148 |

\* cited by examiner

*Primary Examiner* — Jack I. Berman
*Assistant Examiner* — Johnnie Smith (57) ABSTRACT

One embodiment of this fastening apparatus comprises a body with a passage through its length, a threaded member, a locking member, and a bowed ring. The threaded member is retained by the locking member in the passage. The bowed ring is disposed on the body and is configured to be flexible. This body may be fabricated of graphite in one instance.

6 Claims, 7 Drawing Sheets

FASTENING APPARATUS

FIELD

This invention relates to a fastening apparatus, and, more particularly, to a fastening apparatus that prevents over-tightening and that reduces contamination from stainless steel or other metals.

BACKGROUND

Parts, such as graphite shields and electrodes, need to be fastened to other components within an ion implanter or other plasma processing tool. Previous methods of fastening have used stainless steel vented shoulder screws or bearing shims. However, stainless steel or other metal fastening devices have two drawbacks. First, when over-tightened, these devices may crack the part being fastened to another component. Second, stainless steel or other metals contaminate the beam or workpiece being processed or implanted. Merely covering a stainless steel or other metal fastener with a supplementary graphite shield increases material costs and complexity without addressing the problem of over-tightening parts. Graphite itself is also prone to cracking. If a supplementary shield or graphite fastening device cracks, it may prevent or impede repair or replacement.

Accordingly, there is a need in the art for an improved fastening apparatus and, more particularly, a fastening apparatus that prevents over-tightening and that reduces contamination from stainless steel or other metals.

SUMMARY

According to a first aspect of the invention, a fastening apparatus is provided. The fastening apparatus comprises a graphite body defining a passage through a length of the body; and a threaded member disposed in the passage.

According to a second aspect of the invention, a fastening apparatus is provided. The fastening apparatus comprises a body defining a passage through the length of the body, the body having a first region with a first dimension, a second region with a second dimension, and a third region between the first region and the second region with a third dimension, the second dimension being smaller than the first dimension, the third dimension being smaller than the second dimension; a threaded member; a locking member disposed in the passage, the locking member configured to retain the threaded member; and a bowed ring disposed about the third region of the body, the bowed ring configured to be flexible.

According to a third aspect of the invention, an ion implanter is provided. The ion implanter comprises an ion source that generates ions; a workpiece that the ions are directed toward; a fastening apparatus comprising a graphite body defining a passage through a length of the body and a threaded member disposed in the passage; a first component; and a second component secured to the first component with the fastening apparatus.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
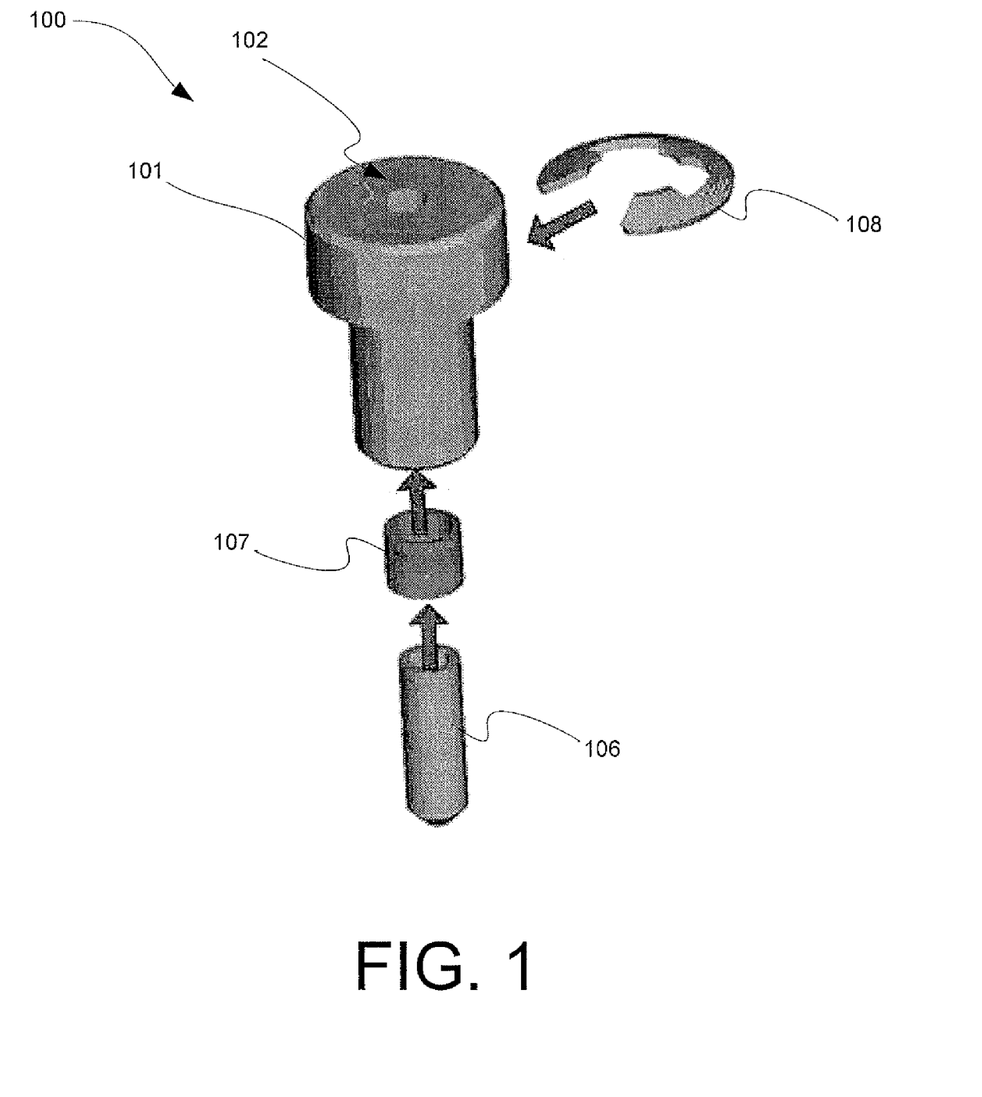
FIG. 1 is an exploded perspective view of a first embodiment of a fastening apparatus.

FIG. 1 is an exploded perspective view of a first embodiment of a fastening apparatus 100. The passage 102 defined by the body 101 of the fastening apparatus 100 is configured to receive the locking member 107. The locking member 107 is configured to retain the threaded member 106. The threaded member 106 may be screwed into the locking member 107 by hand or with a tool and then inserted into the passage 102. The threaded member 106 also may be disposed in the locking member 107 by first disposing the locking member 107 in the passage 102 and then screwing the threaded member 106 into the locking member 107 using a tool, such as, for example, an Allen wrench.

The bowed ring 108, which in this particular embodiment is a bowed e-ring, is disposed about the body 101. The bowed ring 108 also may be a bowed washer or a rubber ring in another instance. While a bowed ring 108 is used in this instance, other embodiments may use a flat, rather than bowed, ring.

In this particular embodiment, when the bowed ring 108, locking member 107, and threaded member 106 are disposed on or about the body 101, the fastening apparatus 100 may be used to fasten a component to another part or component. While the threaded member 106 may be metal, it may be proportionally smaller than the body 101 and the body 101, in one particular embodiment, is graphite. This reduces contamination due to exposed metal within an ion implanter because the only exposed metal is through the passage 102.

Figure 2:
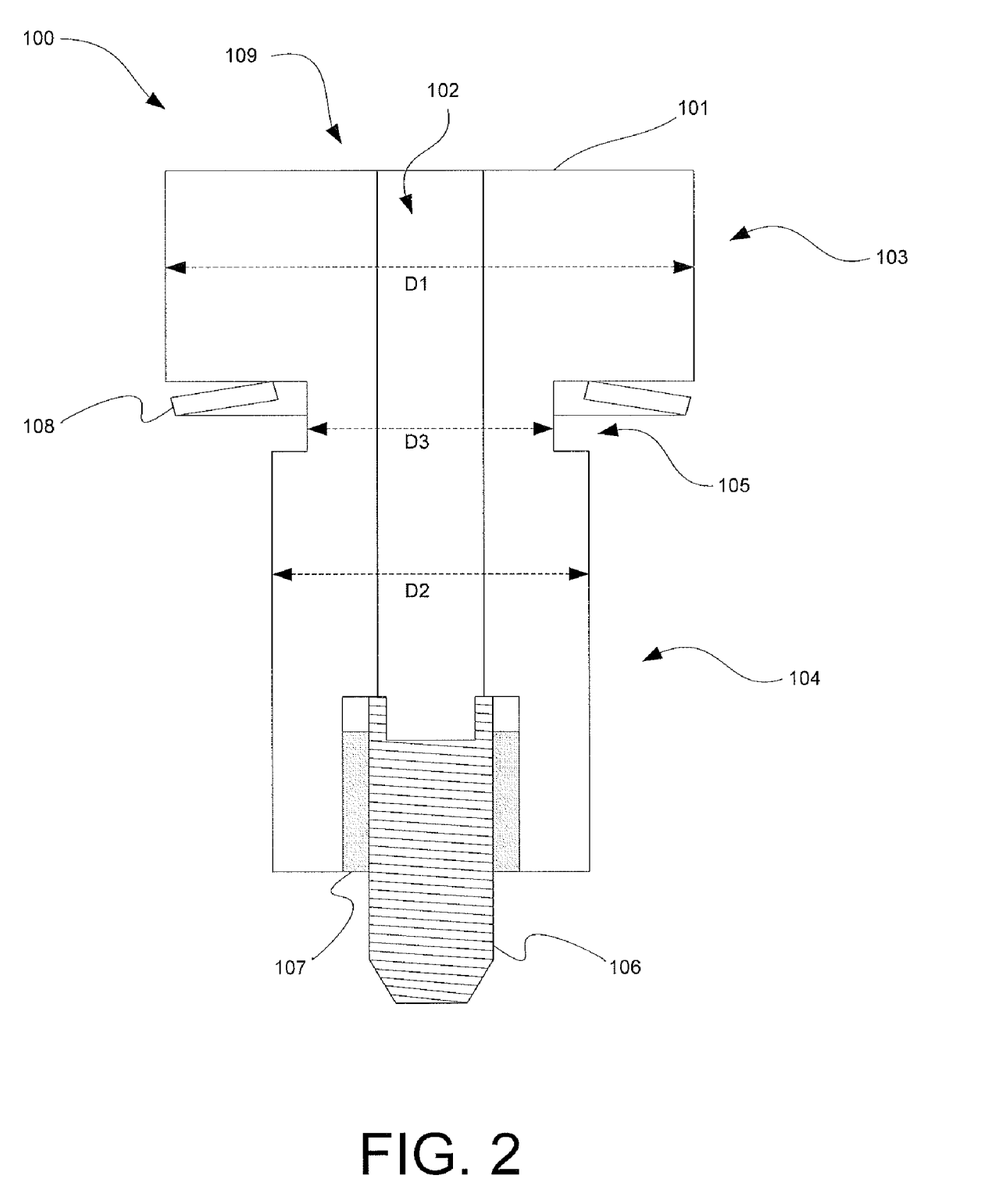
FIG. 2 is a cross-sectional view of the first embodiment of a fastening apparatus of FIG. 1.

FIG. 2 is a cross-sectional view of the first embodiment of a fastening apparatus 100 of FIG. 1. The fastening apparatus 100 has a body 101 having a top surface 109. This body 101 comprises a first region 103, a second region 104, and a third region 105. The top surface 109 of the body 101 also defines an passage 102 through the length of the body 101. In this particular embodiment, the body 101 is a shoulder pin and may be fabricated of or coated with graphite, a material containing graphite, or another compound that does not contaminate an ion implanter. The periphery of the top surface 109 is round in this particular embodiment, but the top surface 109 also may be hexagonal, square, or other shapes.

On the body 101 in this particular embodiment, the second region 104 has a dimension (D2) approximately smaller than the dimension (D1) of first region 103 and the third region 105 has a dimension (D3) approximately smaller than the dimension (D2) of the second region 104. A bowed ring 108 is disposed about the third region 105 of the body 101 in this particular embodiment. This bowed ring 108 may be fabricated of stainless steel and is configured to absorb differences in load or to be flexible. The shape or design of the bowed ring 108 may allow the bowed ring 108 to be configured to be retained around the third region 105 of the body 101. Thus, the bowed ring 108 may be captive. The bowed ring 108 may be a bowed e-ring or some other form of angled ring or semicircular device.

Figure 6:
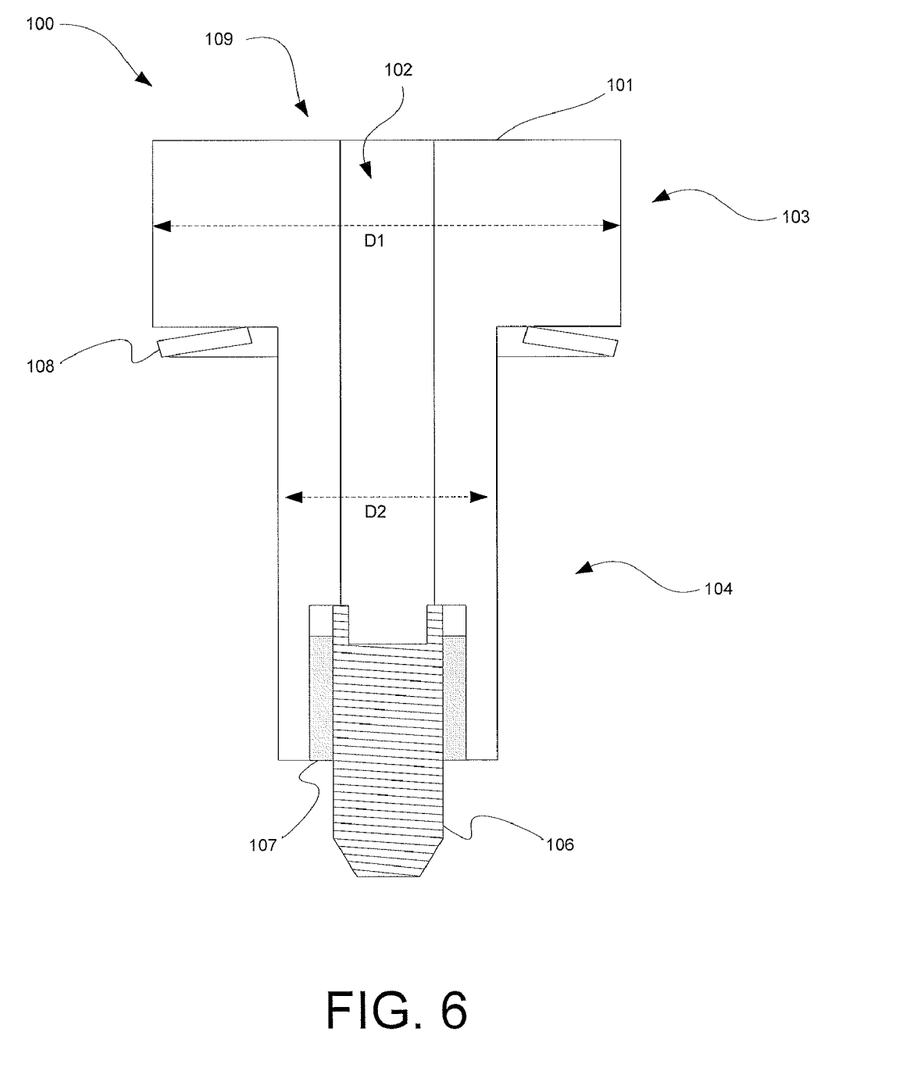
FIG. 6 is a second embodiment of a fastening apparatus.

In another embodiment, the body 101 has only a first region 103 and second region 104 without a third region 105. FIG. 6 illustrates this embodiment of a fastening apparatus 100. In this particular embodiment, the body 101 is approximately T-shaped and the dimension D2 is approximately less than the dimension D1. The bowed ring 108 is disposed around the second region 104 in this particular embodiment.

The fastening apparatus 100 includes a threaded member 106. This is disposed within the passage 102. The threaded member 106 is configured to receive a tool, such as a screwdriver, Allen wrench, hex key, or other tool known to those skilled in the art. In one particular embodiment, the threaded member 106 is a stainless steel socket set screw, although other threaded devices also may be used. The threaded member 106 may be disposed or rest against the body 101.

A locking member 107 is disposed within the passage 102. This locking member 107 is configured to retain the threaded member 106. The locking member 107 is a stainless steel screw lock helicoil threaded insert in one particular embodiment, though other devices that can retain the threaded member 106 within the passage 102 also may be used. The locking member 107 grips the threaded member 106. In another embodiment, a different locking member 107 configured to spin or rotate as the threaded member 106 is translated. In yet another embodiment, the threaded member 106 is screwed directly into the body 101 without a locking member 107.

Figure 3:
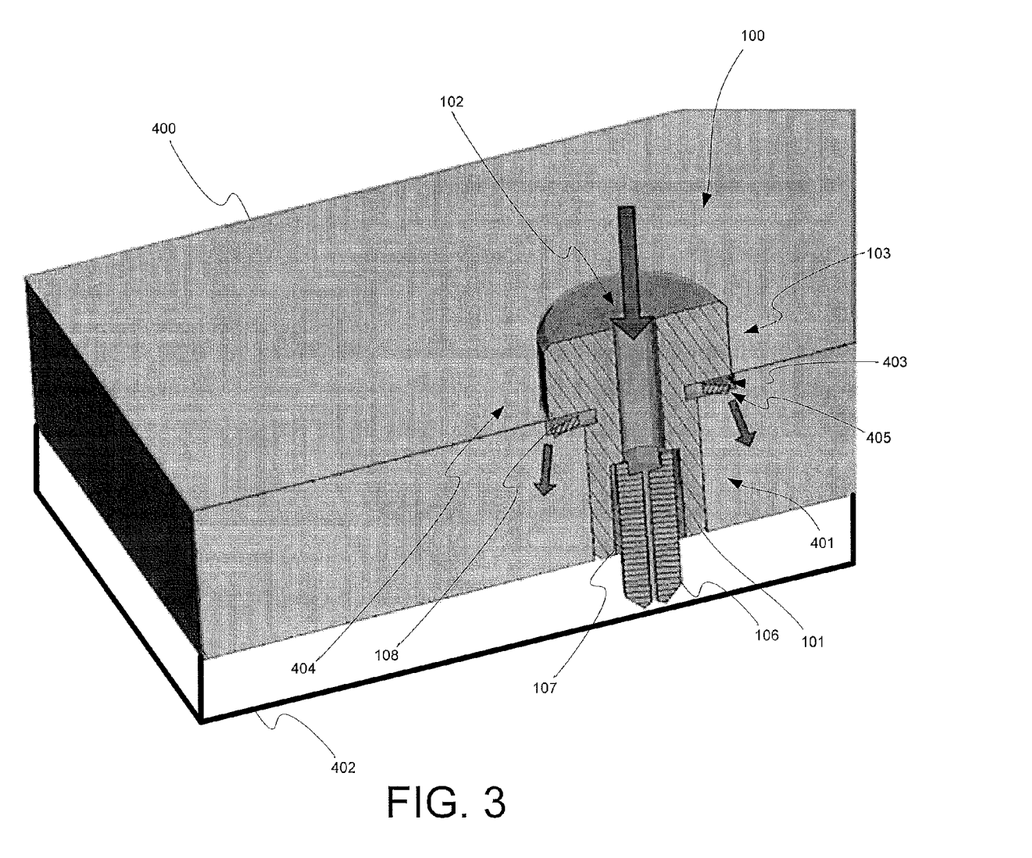
FIG. 3 is a cross-sectional view of the first embodiment of a fastening apparatus inserted into a component or part.

FIG. 3 is a cross-sectional view of one embodiment of a fastening apparatus 100 inserted into a component or part. The fastening apparatus 100 is inserted into a component 400, such as a graphite shield or an electrode in an ion implanter, to secure it to another component or part below the component 400, such as component 402, which may be stainless steel or aluminum. For example, the resolving aperture in an ion implanter includes a graphite aperture, a deceleration lens includes a graphite lens, and the ion source includes shielding, all of which may benefit from the fastening apparatus 100. The component 402 may have a threaded hole, in one embodiment.

The component 400 and component 402 may define an opening 401 configured to receive the fastening apparatus 100. At least part of the body 101 of the fastening apparatus 100 may protrude from the component 400. However, in another embodiment, the fastening apparatus 100 may be flush with the component 400 after insertion.

To fasten the component 400 to the component 402, the fastening apparatus 100 is inserted into the opening 401. This may be by hand or with a tool. A tool, such as a screwdriver, Allen wrench, hex key, or other tool known to those skilled in the art is inserted into the passage 102 so that it can be disposed on the threaded member 106. When the threaded member 106 is tightened using the tool, the threaded member 106 fastens the component 400 to the component 402. Because the locking member 107 holds the threaded member 106, the entire fastening apparatus 100 is translated, and not just the threaded member 106. Use of the threaded member 106 prevents damage to the body 101 because, rather than the body 101, the threaded member 106 has force exerted upon it by the fastening apparatus 100. The body 101 may spin while tightening, but no force is exerted on the body 101 directly by the tool. In another embodiment, the body 101 does not spin due to the design of the locking member 107.

As the fastening apparatus 100 is inserted farther into the opening 401 due to the rotation or tightening of the threaded member 106, the bowed ring 108 bends or flexes and absorbs some of the pressure that otherwise would be exerted on the body 101 by the component 400. Thus, the fastening apparatus 100 cannot be over-inserted into the component 400 because the body 101 prevents over-insertion due to its shape, preventing damage to the component 400. The surface 403 of the first region 103 of the body 101 may contact a surface 404 of the component 400 and/or the bowed ring 108 may contact a surface 405 of the component 400. While a surface 405 is illustrated, in some embodiments the component 400 has only a flat surface 404 and the bowed ring 108 may contact the flat surface 404 of the component 400. The bowed ring 108 may prevent over-tightening of the fastening apparatus 100 and damage to the body 101 or component 400. This is because the bowed ring 108 may absorb some of the pressure exerted by the component 400 on the first region 103 of the body 101.

Figure 4:
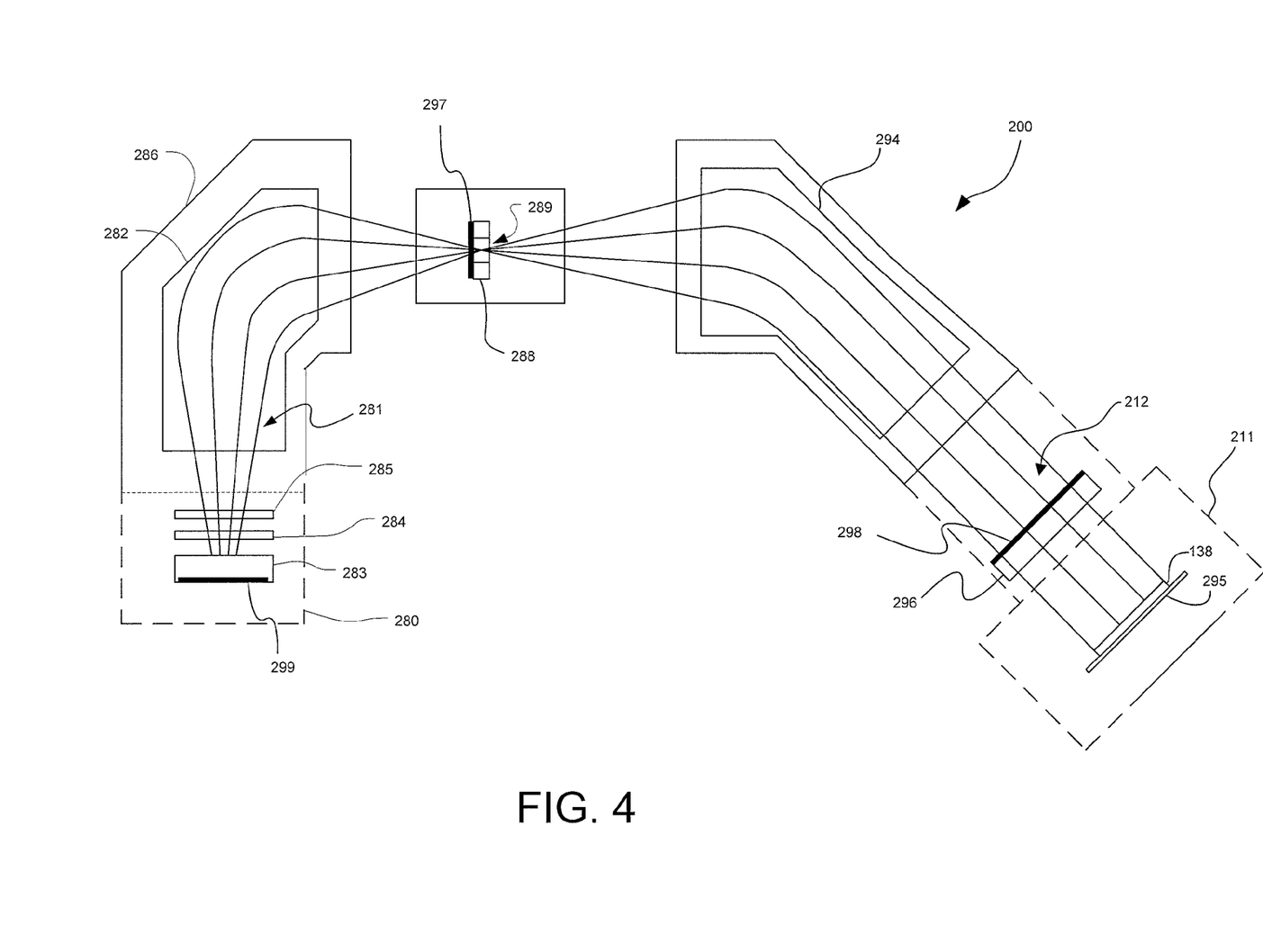
FIG. 4 is a block diagram of a beam-line ion implanter.

FIG. 4 is a block diagram of a beam-line ion implanter 200. In one instance, this may be for doping a semiconductor wafer. Those skilled in the art will recognize that the beam-line ion implanter 200 is only one of many examples of beam-line ion implanters that can produce ions. Thus, this fastening apparatus is not limited solely to the beam-line ion implanter 200 of FIG. 4.

In general, the beam-line ion implanter 200 includes an ion source 280 to generate ions that form an ion beam 281. The ion source 280 may include an ion chamber 283. A gas is supplied to the ion chamber 283 where the gas is ionized. This gas may be or may include or contain, in some embodiments, hydrogen, helium, other rare gases, oxygen, nitrogen, arsenic, boron, phosphorus, carborane, alkanes, or another large molecular compound. The ions thus generated are extracted from the ion chamber 283 to form the ion beam 281. The ion beam 281 passes through a suppression electrode 284 and ground electrode 285 to mass analyzer 286. Mass analyzer 286 includes resolving magnet 282 and masking electrode 288 having resolving aperture 289. Resolving magnet 282 deflects ions in the ion beam 281 such that ions of a desired ion species pass through the resolving aperture 289. Undesired ion species do not pass through the resolving aperture 289, but are blocked by the masking electrode 288.

Ions of the desired ion species pass through the resolving aperture 289 to the angle corrector magnet 294. Angle corrector magnet 294 deflects ions of the desired ion species and converts the ion beam from a diverging ion beam to ribbon ion beam 212, which has substantially parallel ion trajectories. The beam-line ion implanter 200 may further include acceleration or deceleration units in some embodiments. This particular embodiment has a deceleration unit 296.

An end station 211 supports one or more workpieces, such as workpiece 138, in the path of ribbon ion beam 212 such that ions of the desired species are implanted into workpiece 138. The workpiece 138 may be, for example, a silicon wafer or a solar panel. The end station 211 may include a platen 295 to support the workpiece 138. The end station 211 also may include a scanner (not shown) for moving the workpiece 138 perpendicular to the long dimension of the ribbon ion beam 212 cross-section, thereby distributing ions over the entire surface of workpiece 138. Although the ribbon ion beam 212 is illustrated, other embodiments may provide a spot beam. It will be understood to those skilled in the art that the entire path traversed by the ion beam is evacuated during ion implantation. The ion implanter 200 may include additional components known to those skilled in the art and may incorporate hot or cold implantation of ions in some embodiments.

The fastening apparatus 100 may be used, for example, to fasten a graphite aperture 297 about the resolving aperture 289 or on the masking electrode 288. A graphite lens 298 may be fastened to a lens in the deceleration unit 296. Shielding 299, which may be fabricated of graphite or other materials, may be fastened within the ion source 280 or ion chamber 283. The fastening apparatus 100 also may be used to fasten other components to other parts of the beam-line ion implanter 200.

One skilled in the art will recognize other systems and processes involved in semiconductor manufacturing, other systems and processes involved in plasma treatment, or other systems and processes that use accelerated ions that may use an embodiment of the fastening apparatus described herein. Some examples of this, for example, are a plasma doping tool, an ion shower, or a plasma immersion tool. Other semiconductor processing equipment known to those skilled in the art that can accelerate species and implant species into a substrate also may use an embodiment of the fastening apparatus described herein. Other semiconductor processing equipment, such as chemical vapor deposition (CVD), physical vapor deposition (PVD), or etch tools also may use a fastening apparatus consistent with an embodiment of the invention described herein. Embodiments of this fastening apparatus also may be used outside of semiconductor processing, such as in other electronic, medical, or mechanical devices. Thus, the embodiments of this fastening apparatus are not limited solely to beam-line ion implanters.

Figure 5:
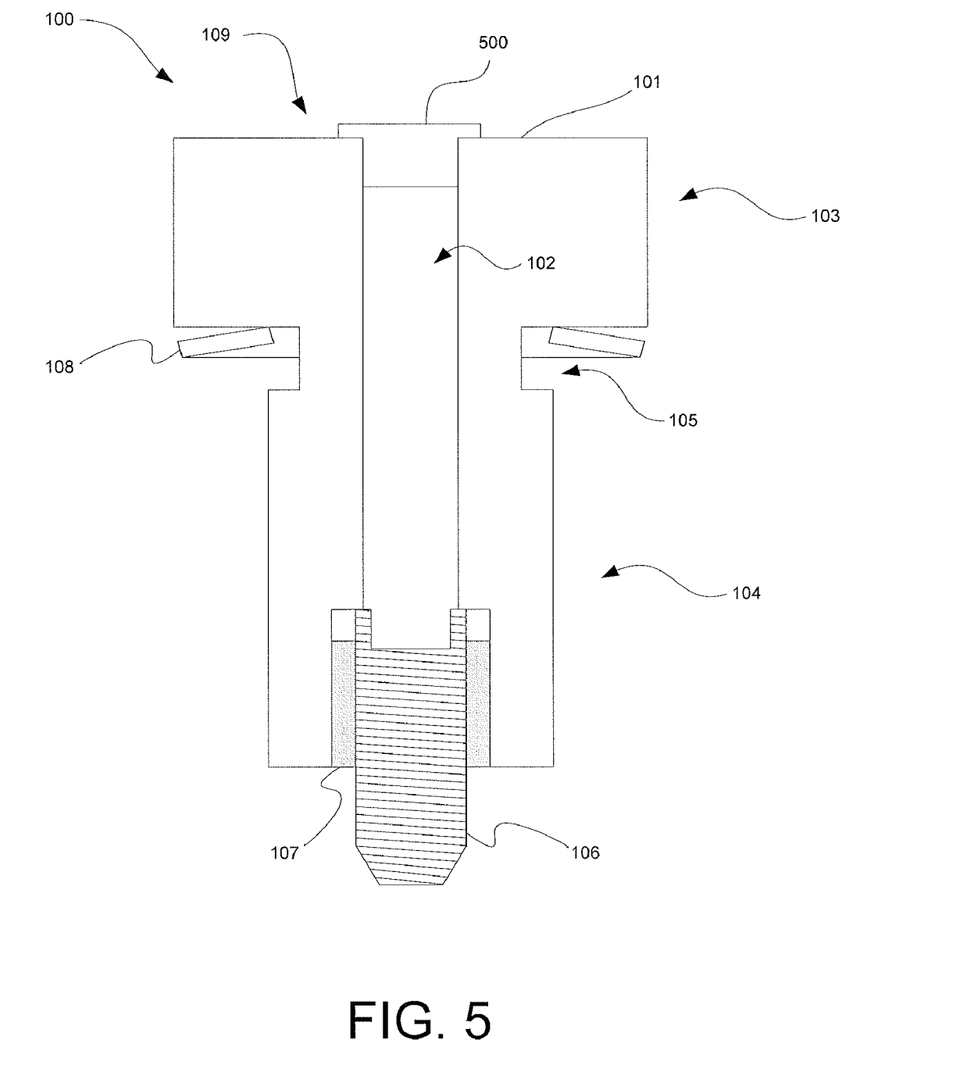
FIG. 5 is a cross-sectional view of the first embodiment of the fastening apparatus of FIG. 2 with a plug.

FIG. 5 is a cross-sectional view of the first embodiment of the fastening apparatus 100 of FIG. 2 with a plug 500. The plug 500 may be fabricated of or coated with graphite, but also may be fabricated of or coated with a graphite-containing compound, another compound that does not contaminate an ion implanter, or the same material as the body 101. The plug 500 is configured to block the passage 102 opposite the threaded member 106. This further reduces contamination due to metal in an ion implanter because the threaded member 106 is no longer exposed through the passage 102.

In one embodiment, the plug 500 is not configured to be removed and the fastening apparatus 100 may be unscrewed by twisting the entire fastening apparatus 100 by hand. In a second embodiment, the plug 500 is configured to be removed and the fastening apparatus 100 may be translated or removed using a tool, such as a screwdriver, Allen wrench, hex key, or other tool known to those skilled in the art.

Figure 7:
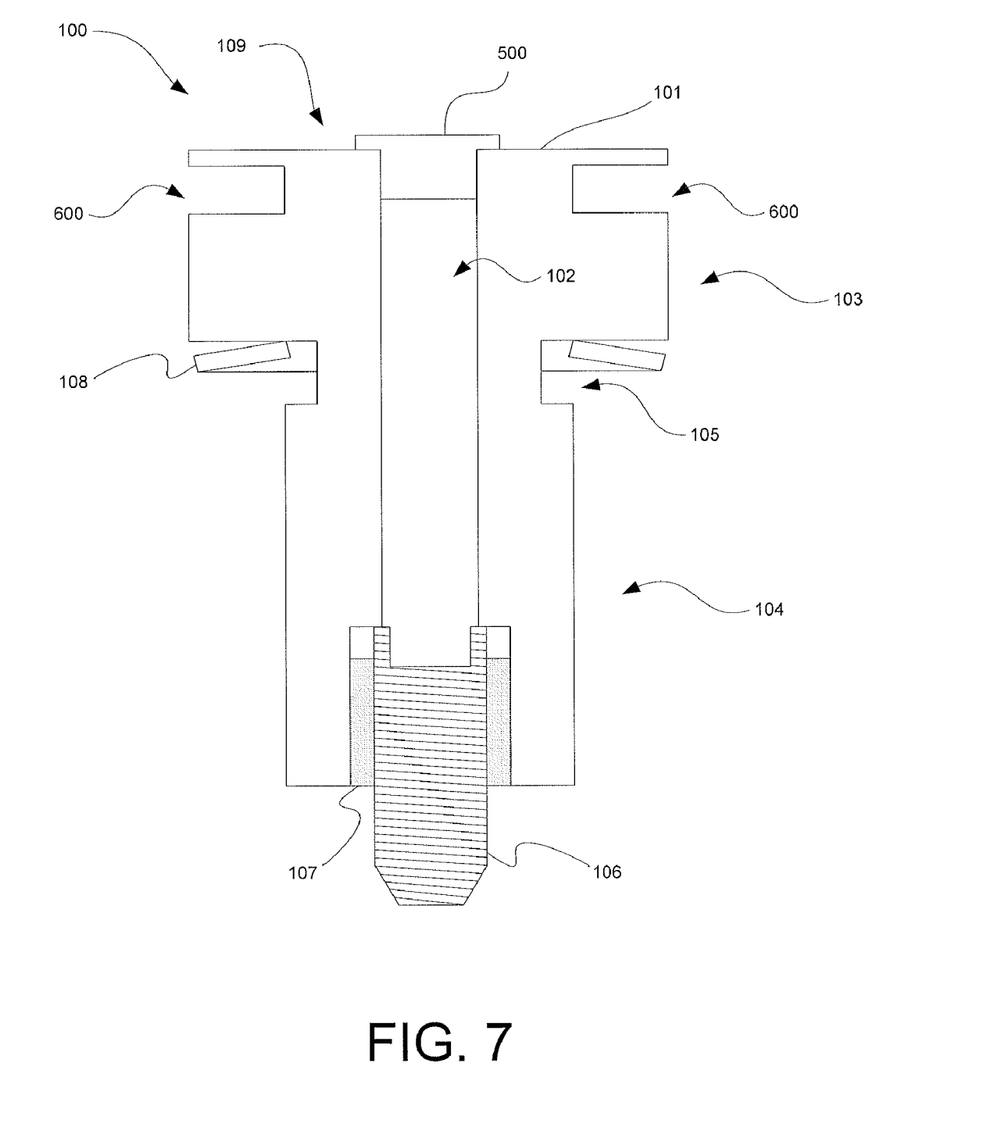
FIG. 7 is a third embodiment of a fastening apparatus.

FIG. 7 is another embodiment of a fastening apparatus. Notches 600 are defined by the first region 103 of the body 101. The notches 600 are configured to allow the fastening apparatus 100 to be removed if the plug 500 is inserted into the passage 102 without exposing any stainless steel, such as that from the threaded member 106. A rod, Allen wrench, hex key, screwdriver, or other object may be inserted into the notches 600 to twist the fastening apparatus 100. FIG. 7 illustrates two notches 600, but other embodiments include one notch or more than two notches. Thus, the number of notches is not limited solely to that illustrated in FIG. 6.

In this particular embodiment, the notches 600 are parallel to the top surface 109 of the body 101. In other embodiments, the notches 600 may be parallel to the passage 102 in the body 101 or at other angles in the body 101. The notches 600 may be defined by the top surface 109 in one instance.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A fastening apparatus comprising:
    a body defining a passage through a length of said body, said body having a first region with a first dimension, a second region with a second dimension, and a third region between said first region and said second region with a third dimension, said second dimension being smaller than said first dimension, said third dimension being smaller than said second dimension, and wherein at least an exterior surface of said body is composed of graphite;
    a threaded member having a width configured to be disposed in said passage and a threaded member length less than said length of said body;
    a locking member disposed in said passage, said locking member configured to retain said threaded member such that said threaded member protrudes from said passage; and
    a flexible ring disposed about said third region of said body.

2. The fastening apparatus claim 1, wherein said flexible ring is bowed.

3. The fastening apparatus of claim 2, wherein said flexible ring is a bowed e-ring.

4. The fastening apparatus of claim 1, wherein said flexible ring is fabricated of stainless steel.

5. The fastening apparatus of claim 1, wherein said body defines at least one notch on said first region configured to aid in removal of said fastening apparatus.

6. The fastening apparatus of claim 1, further comprising a plug configured to be disposed in said passage of said body opposite of said threaded member, said plug fabricated of graphite.

* * * * *